United States Patent
Hausmann et al.

(10) Patent No.: US 8,077,803 B2
(45) Date of Patent: Dec. 13, 2011

(54) QUARTER DUTY CYCLE PULSE GENERATOR FOR INTERLEAVED SWITCHING MIXER

(75) Inventors: Kurt B. Hausmann, Chandler, AZ (US); Mark A. Kirschenmann, Chandler, AZ (US); Lillian G. Lent, Gilbert, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 835 days.

(21) Appl. No.: 12/056,652

(22) Filed: Mar. 27, 2008

(65) Prior Publication Data

US 2009/0245420 A1 Oct. 1, 2009

(51) Int. Cl.
*H04L 27/12* (2006.01)
(52) U.S. Cl. ........ 375/302; 375/299; 375/295; 375/298; 375/296; 375/355; 455/118; 455/318; 455/313; 329/300; 329/304
(58) Field of Classification Search .................. 375/302, 375/299, 295, 298, 296, 355; 455/118, 318, 455/313
See application file for complete search history.

(56) References Cited

U.S. PATENT DOCUMENTS

| | | | |
|---|---|---|---|
| 7,085,549 B2 | 8/2006 | Peterson et al. | |
| 2002/0118773 A1* | 8/2002 | Minasi et al. | 375/322 |
| 2004/0137862 A1 | 7/2004 | Tanaka et al. | |
| 2004/0198297 A1* | 10/2004 | Oh et al. | 455/318 |
| 2005/0078766 A1* | 4/2005 | Simon | 375/296 |
| 2006/0154625 A1* | 7/2006 | Malone et al. | 455/118 |
| 2007/0201581 A1* | 8/2007 | Wagh et al. | 375/308 |
| 2007/0279109 A1 | 12/2007 | Kirschenmann | |
| 2008/0100387 A1* | 5/2008 | Chen et al. | 331/22 |
| 2008/0284487 A1* | 11/2008 | Pullela et al. | 327/355 |
| 2009/0068975 A1* | 3/2009 | Luong et al. | 455/325 |
| 2009/0174459 A1* | 7/2009 | Cicalini | 327/356 |

* cited by examiner

*Primary Examiner* — Kenneth Lam
(74) *Attorney, Agent, or Firm* — Hamilton & Terrile, LLP; Michael Rocco Cannatti

(57) ABSTRACT

An integrated transmit circuit includes a voltage controlled oscillator (702) for generating an input frequency signal (e.g., VCO) that is provided to a divide by two quadrature generator circuit (706) which generates therefrom in-phase and quadrature clocking signals (I, IB, Q, QB) that are applied to control a plurality of transmission gates (711-718) configured in a matched switching topology (710) so as to selectively pass pulses from the input frequency signal, thereby generating interleaved LO pulses ($\varnothing_1, \varnothing_{1B}, \ldots \varnothing_4, \varnothing_{4B}$). By applying the interleaved LO pulses to control the transmission gates (26, 28, 30, 32, 34, 36, 38, and 40) in the upmixer (720), the +I, −I, +Q, −Q input signals are interleaved over a plurality of phases of a carrier period to produce differential outputs (42, 44).

18 Claims, 7 Drawing Sheets

QUARTER DUTY CYCLE PULSE GENERATOR FOR INTERLEAVED SWITCHING MIXER

BACKGROUND OF THE INVENTION

1. Field of the Invention

The present invention relates generally to the field of communications systems. In one aspect, the present invention relates to a circuit and method of generating modulated radio frequency ("RF") signals having an interleaved IQ modulation.

2. Description of the Related Art

Modern communication systems, such as cordless telephones, pagers, cellular telephones, and global positioning systems, generally communicate using radio frequency (RF) signals. Voice/data input into a cellular telephone is a low frequency or baseband signal. A transmitter converts the baseband signal to a radio frequency signal for transmission by the cellular telephone. The transmitter typically includes a low frequency data modulation stage, one or more frequency conversion stages and a high frequency power amplifier and transmission stage. The data modulation stage converts raw data into baseband signals in accordance with a particular wireless communication standard. For example, the baseband signal can be generated using any of a variety of modulation techniques, such as quadrature modulation (also known as IQ modulation and Quadrature Amplitude Modulation (QAM)) which is a technique used with modern communication systems which enables two independent signals to be combined at a transmitter, transmitted on the same transmission band, and separated at a receiver. The principle of quadrature modulation is that two separate signals, I and Q (In-phase and Quadrature phase), are modulated by using the same carrier wave frequency, but the carrier wave of signal Q is ninety degrees out of phase with the carrier wave of signal I. Conventionally, two modulation inputs are applied to two separate modulators, each of which is supplied with sine or cosine carriers, respectively. At the frequency conversion stage, the baseband signal output of the modulators are mixed with one or more local oscillations to produce RF signals containing the I and Q information. While conventional mixers algebraically combine the RF signals to create a single RF transmit signal, switched-mode mixers or modulators have been shown to present improved noise, linearity, and current-drain performance. For example, U.S. Patent Publication No. US2007/0201581/A1 to Wagh et al. entitled "RF Transmitter with Interleaved IQ Modulation" describes an RF modulator mixer which interleaves in-phase and quadrature signals. However, there remain design challenges with the operation of switched mode mixers in terms of suppressing carrier and sideband frequencies. For example, when switched-mode mixers require interleaved local oscillator signals as inputs, the performance of the mixer is impaired if there are propagation delays in the generated local oscillator signals. With higher frequency transmitters, the propagation delay issue becomes more problematic.

Accordingly, there is a need for an improved transceiver circuit to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description of a preferred embodiment is considered in conjunction with the following drawings, in which.

DETAILED DESCRIPTION

A high frequency transmit circuit is described which generates matched differential interleaved local oscillator (LO) signals indirectly from a quadrature generator using a matched switching topology which does not have any inherent imbalances that can create propagation delays between different LO signals. In a single-sideband upmixer implementation, a quadrature generator receives an input frequency that is a multiple (e.g., 2× or 4×) of the desired local oscillator signal required for the interleaved upmixer. The received input frequency signal has the exact pulse that is needed for the interleaved upmixer, although it also has additional pulses that are not needed for the LO time period. To remove the unneeded additional pulses, the quadrature generator uses a frequency divider circuit (e.g., divide by 2 or divide by 4) to generate I and Q LO (1×) waveforms which are used to control the transmission gating of the received input frequency signal (and its complement) to generate the four (differentially eight) interleaved LO pulses.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. Such descriptions and representations are used by those skilled in the art to describe and convey the substance of their work to others skilled in the art. Various illustrative embodiments of the present invention will now be described in detail below with reference to the figures.

Figure 1:
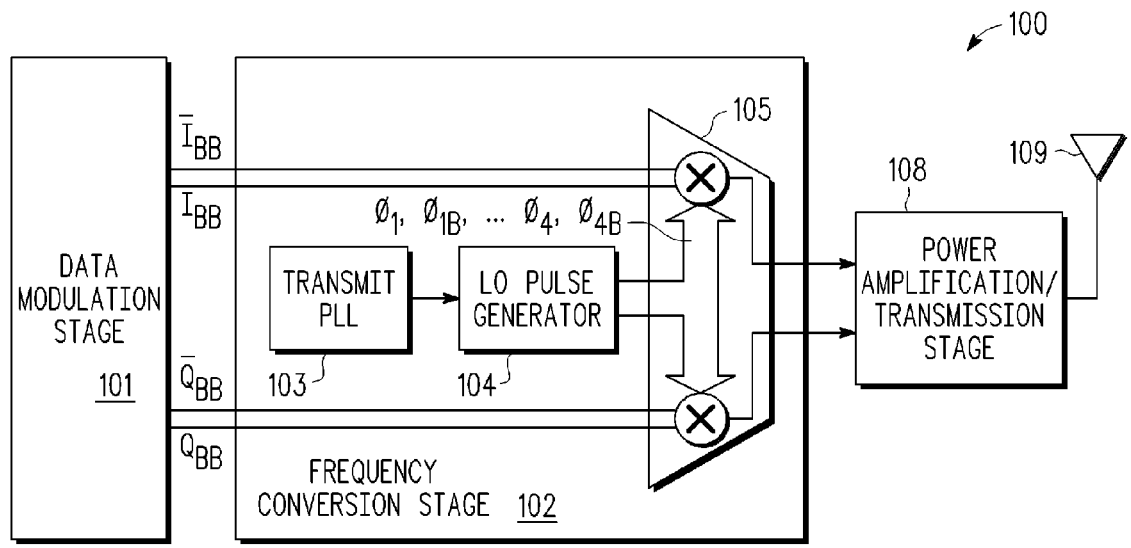
FIG. 1 depicts a simplified block diagram of a transmitter system in which selected embodiments of the present invention may be implemented.

Turning now to FIG. 1, there is shown a simplified block diagram of a transmitter system 100 in which selected embodiments of the present invention may be implemented. The depicted transmitter system 100 may be implemented as a wireless communication device (e.g., a cellular telephone handset or a wireless data modem) which receives an incoming data (not shown) at the data modulation stage 101. In operation, the data modulation stage 101 modulates the received data into in-phase (I) and quadrature (Q) baseband outputs (e.g., $I_{BB}$, $Q_{BB}$) that are provided to the frequency conversion stage 102 which is configured to up-convert the frequency of the received baseband signals and to provide the up-converted signal to the power amplification and transmission stage 108 for transmission over the transmit antenna 109. In various embodiments, the power amplification and transmission stage 108 amplifies and/or filters the up-converted RF signal to produce outbound RF signal in accordance with a signaling protocol, such as the Global System for Mobile (GSM) or Enhanced Data Rates for GSM Evolution (EDGE) specifications for cellular telephones. GSM operates using Gaussian Minimum Shift Keying (GMSK), while EDGE operates using 8 Phase Shift Keying (8-PSK). The 8-PSK used in EDGE places greater radio frequency performance requirements on the power amplification and transmission stage 108. For example, higher linearity is desired because 8-PSK is more sensitive to nonlinear distortion. Other transmission schemes in addition to those mentioned can also be used.

Though not shown, it will be appreciated that the transmit system 100 may be a subsystem of a transceiver system which includes a receiver subsystem for receiving a modulated radio frequency (RF) from a receive antenna and providing a modulated baseband signal to a baseband circuit. In operation, the transmit system 100 up-converts the frequency of the received baseband signal outputs (e.g., $I_{BB}$, $Q_{BB}$) with a switching mixer 105 which directly converts the received baseband signal outputs into an RF signal under control of matched differential interleaved LO signals (e.g., $\mathcal{O}_1$, $\mathcal{O}_{1B}$, ... $\mathcal{O}_4$, $\mathcal{O}_{4B}$) provided by pulse generator module 104. To generate the matched differential interleaved LO signals, a reference signal (e.g., from a crystal oscillator) provided to the transmit system 100 is processed by a transmit phase locked loop (PLL) circuit 103 to provide a high frequency input signal to the pulse generator module 104, which in turn uses the divided output of a quadrature generator to control the transmission gating of the received high frequency input signal (and its complement) to generate the four (differentially eight) interleaved LO pulses.

In accordance with selected embodiments, the interleaved IQ modulation system described herein may be implemented in whole or in part as an integrated circuit. Of course, additional, different, or fewer components may be provided as part of the integrated circuit, and the integrated circuit may be implemented as an application specific integrated circuit, processor, digital signal processor, field programmable gate array, digital circuit, analog circuit, or combinations thereof.

Figure 2:
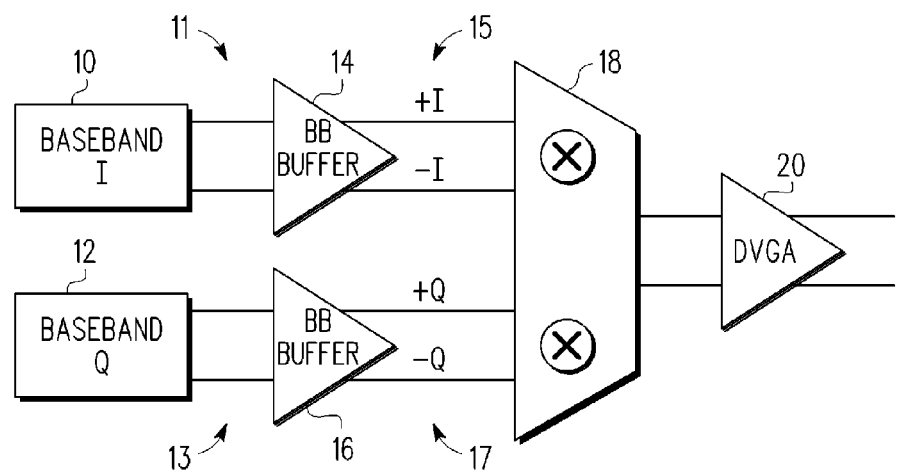
FIG. 2 is a block diagram of an interleaved IQ modulation system in accordance with selected embodiments of the present invention.

FIG. 2 depicts in block diagram form additional details of an interleaved IQ modulation system in accordance with selected embodiments of the present invention. As depicted, the interleaved IQ architecture includes a baseband stage 10 for generating in-phase signals and a baseband stage 12 for generating quadrature signals. The baseband stages 10, 12 are coupled through baseband buffers 14, 16, respectively, to a switching mixer. Though the baseband buffers 14, 16 are depicted separately, they may be incorporated into the baseband stages 10, 12. The switching mixer 18 interleaves the buffered in-phase and quadrature phase analog signals to the attenuator 20 by communicating a first in-phase signal at a first phase, communicating a first quadrature phase signal at a second phase, communicating a second in-phase signal at a third phase, and communicating a second quadrature phase signal at a fourth phase. The attenuator 20 may be implemented with any desired power amplification circuit, such as a digital variable gain amplifier (DVGA) which uses a passive R-2R ladder architecture.

In operation, each of the baseband stages 10, 12 receive a low frequency input signal, such that the baseband stage 10 receives an in-phase (I) input signal and the baseband stage 12 receives a quadrature (Q) phase input signal. The I and Q input signals are baseband signals whose amplitude and phase represent coded 1's and 0's from the digital baseband, and which may include voice or data from a communication device user, such as a cellular phone user. The baseband stages 10, 12 provide digital modulation signals 11, 13 to buffers 14, 16 which may be implemented as operational amplifiers to filter the digital modulation signals 11, 13 to remove high frequency noise. In addition, the buffers 14 and 16 may amplify the digital modulation signals 11, 13. In this way, the buffer 14 generates filtered signals +I, −I as a buffered output 15, while the buffer 16 generates filtered signals +Q, −Q as a buffered output 17. The buffered outputs 15, 17 are provided to the switching mixer 18 which also receives one or more local oscillator clock signals from a pulse generator (not shown) or other clocking mechanism. The switching mixer 18 combines the signals by interleaving the signals 15, 17 over phases of the carrier period. For example, the switching mixer 18 may be configured to communicate the signals 15, 17 every ¼ carrier period so that in-phase signal +$I_1$ and in-phase signal −$I_1$ are communicated during a first phase, quadrature-phase signal +$Q_2$ and quadrature-phase signal −$Q_2$ are communicated during a second phase, in-phase signal −$I_3$ and in-phase signal +$I_3$ are communicated during a third phase, and quadrature-phase signal −$Q_4$ and quadrature-phase signal +$Q_4$ are communicated during a fourth phase. In this way, the switching mixer 18 up-converts the signals 15, 17 for transmission by an antenna.

Figure 3:
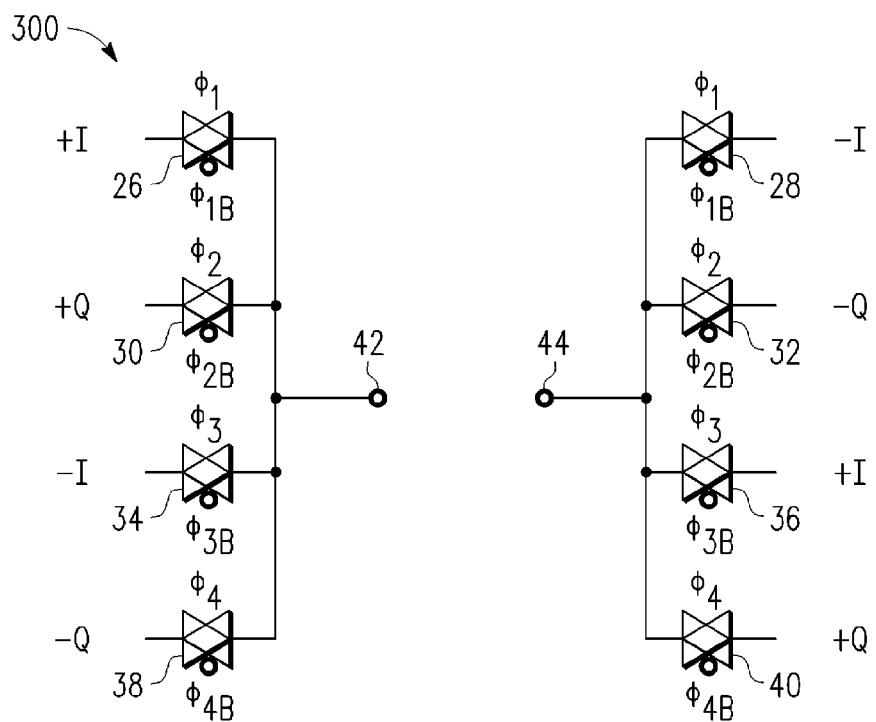
FIG. 3 is a schematic representation of a switching mixer used in the interleaved IQ modulation system in accordance with selected embodiments of the present invention.

To illustrate an example implementation of a switching mixer, reference is now made to FIG. 3 which illustrates a schematic representation of a switching mixer 300 having a number of switches 26, 28, 30, 32, 34, 36, 38, and 40 that are used to interleave the received filtered signals +I, −I, +Q, −Q to produce differential outputs 42 and 44. As depicted, each of the switches is implemented as a transmission gate (T-gate), analog gate, analogue switch or electronic relay which may be formed by connecting an nMOS and a pMOS transistor in parallel with the input at the gate of one transistor being complementary to the input at the gate of the other. Alternatively, n-channel gates can be used as the switches to further reduce power consumption in the circuit. In yet another embodiment, GaAs switches are employed. In selected embodiments, the transmission gate is designed to operate at very high frequencies so as to provide switching speeds in the multi-GHz frequency ranges, such as in the range of at least 100 MHz to 6 GHz, or the 1-2 GHz range or any higher frequency ranges used in communication systems. In operation, the T-gates 26, 28, 30, 32, 34, 36, 38, and 40 are controlled or gated by matched differential interleaved local oscillator signals $Ø_1$, $Ø_2$, $Ø_3$, $Ø_4$ and their respective complements to interleave the received filtered signals +I, −I, +Q, −Q over one carrier period to produce differential outputs 42 and 44. That is, each phase ($Ø_1$-$Ø_4$) operates for ¼ carrier period. For example, during the first phase $Ø_1$, T-gates 26 and 28 operate to transmit the received +I, −I to the differential outputs 42, 44, respectively. Likewise, during the second phase $Ø_2$, T-gates 30 and 32 operate to transmit the received +Q, −Q to the differential outputs 42, 44, respectively. And during the third phase $Ø_3$, T-gates 34 and 36 operate to transmit the received −I, +I to the differential outputs 42, 44, respectively. Finally, during the fourth phase $Ø_4$, T-gates 38 and 40 operate to transmit the received −Q, +Q to the differential outputs 42, 44, respectively.

Mathematically, the switching mixer 300 performs an addition operation that can be represented by the formula: I (t)cos($w_c$t)−Q(t)sin($w_c$t). The signal $LO_I$(t) is the repeating sequence $\{1, 0, -1, 0\}$ at the sample period of a quarter carrier period ($T_c/4$). This sequence is the same as cos($w_c$t) sampled and held at 4 $f_c$. As such, it consists of spectral lines at 4 $Nf_c + f_c$, where N is an integer from −∞ to ∞. Within the band of (−2 $f_c$, 2 $f_c$), however, it is identical to cos($w_c$t). Therefore, the product I(t)*$LO_I$(t) is equivalent to I (t) cos($w_c$t) within the band (−2 $f_c$, 2 $f_c$) (provided that I (t) is band-limited to (−2 $f_c$, 2 $f_c$), which is required for RF modulation). Similarly, the signal $LO_Q$(t) is the sequence $\{0, 1, 0, -1\}$ at the sample rate of 4 $f_c$. Replacing cos($w_c$t) and sin($w_c$t) with the signals $LO_I$(t) and $LO_Q$(t) results in y(t)=I (t) $LO_I$(t)−Q(t) $LO_Q$(t).

When $LO_Q$(t) is non-zero, $LO_I$(t) is zero, and vice versa. For example:

| | | |
|---|---|---|
| $0 < t < T_c/4$: | $LO_I(t) = 1$ | $LO_Q(t) = 0$ |
| $T_c/4 < t < T_c/2$: | $LO_I(t) = 0$ | $LO_Q(t) = 1$ |
| $T_c/2 < t < 3T_c/4$: | $LO_I(t) = -1$ | $LO_Q(t) = 0$ |
| $3T_c/4 < t < T_c$: | $LO_I(t) = 0$ | $LO_Q(t) = -1$. |

This behavior repeats every $T_c$. The signal y(t) obtains the values:

$$0 < t < T_c/4: y(t) = I(t)*1 - Q(t)*0 = I(t)$$

$$T_c/4 < t < T_c/2: y(t) = I(t)*0 - Q(t)*1 = -Q(t)$$

$$T_c/2 < t < 3T_c/4: y(t) = I(t)*-1 - Q(t)*0 = -I(t)$$

$$3T_c/4 < t < T_c: y(t) = I(t)*0 - Q(t)*-1 = Q(t).$$

This behavior repeats every $T_c$, such that:

$$NT_c < t < N T_c + T_c/4: y(t) = I(t)*1 - Q(t)*0 = I(t)$$

$$NT_c + T_c/4 < t < N T_c + T_c/2: y(t) = I(t)*0 - Q(t)*1 = -Q(t)$$

$$NT_c + T_c/2 < t < N T_c + 3T_c/4: y(t) = I(t)*-1 - Q(t)*0 = -I(t)$$

$$NT_c + 3T_c/4 < t < (N+1)T_c: y(t) = I(t)*0 - Q(t)*-1 = Q(t).$$

N∈Integer.

Figure 4:
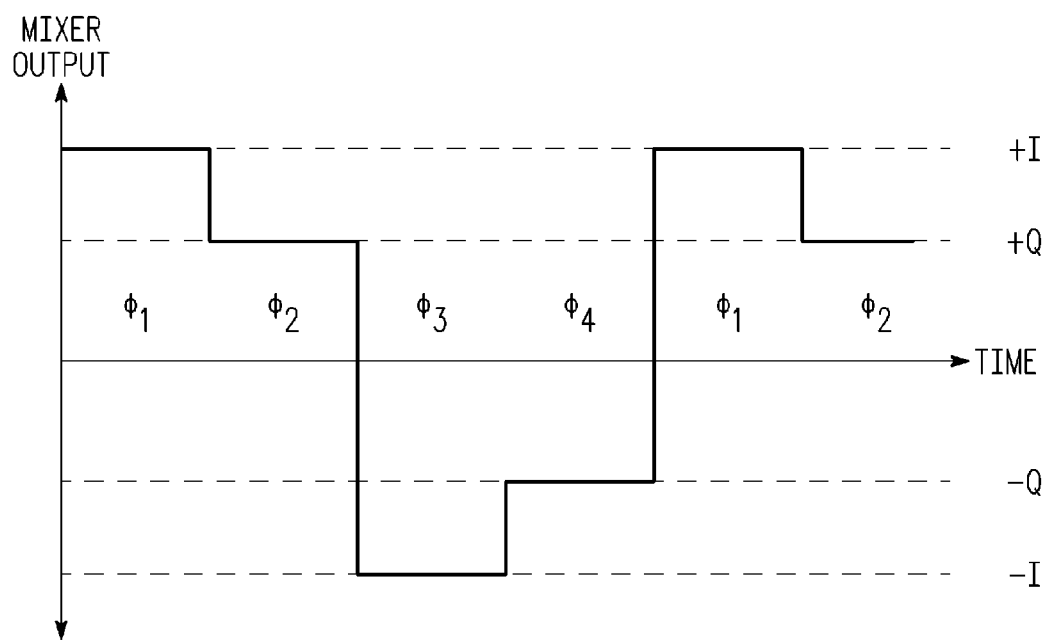
FIG. 4 is waveform depicting the output from an interleaved switching mixer in accordance with selected embodiments of the present invention.

As a result, a multiplexing operation between +/−I (t) and +/−Q (t) produces the intended quadrature mixing as shown in FIG. 4 which depicts a waveform of a first differential output 42 from an interleaved switching mixer 300 in accordance with selected embodiments of the present invention whereby the phase information is imparted by phase-modulating the clocking signals. As depicted, the interleaved switching may implement a conversion to a lower sideband when the +I signal is output during $Ø_1$, the +Q signal is output during $Ø_2$, the −I signal is output during $Ø_3$, and the −Q signal is output during $Ø_4$. However, it will be appreciated that other associations between +/−I and +/−Q and the four phases are possible. For example, the interleaved switching may implement a conversion to an upper sideband when the +I signal is output during $Ø_1$, the −Q signal is output during $Ø_2$, the −I signal is output during $Ø_3$, and the +Q signal is output during $Ø_4$.

With this configuration, the switching mixer 300 modulates high-bandwidth signals and/or signals with large peak-to-average ratios, thereby providing higher efficiency, higher linearity, and lower noise than conventional summers used in IQ modulation. In addition, the switching mixer 300 removes the 50% efficiency loss penalty involved in resistively summing I and Q signals. As a result, the switching mixer 300 can be used to perform IQ modulation, and also to support high bandwidth applications, such as wide-band communication systems (e.g., 3G, OFDM, etc.) which use a polar architecture. Modulation in a polar fashion can be accomplished by setting the two baseband I- and Q-signals both equal to the desired amplitude signal.

To control the T-gates 26, 28, 30, 32, 34, 36, 38, and 40 in the switching mixer 300, matched differential interleaved local oscillator signals $Ø_1$, $Ø_2$, $Ø_3$, $Ø_4$ (and their respective complements) must be generated. In accordance with a first exemplary low band embodiment, the required matched differential interleaved local oscillator signals may be generated with a quarter duty cycle pulse generator 500 such as illustrated by way of example with the schematic representation of FIG. 5. In the depicted pulse generator 500, a voltage controlled oscillator (VCO) 502 is provided which may be part of a transmit PLL circuit. The VCO 502 generates complementary input clock signals 503 which are provided to a VCO buffer 504 which, in turn, generates VCO and VCOB signals to drive the frequency divider circuit 507 to produce in-phase I and quadrature Q clocking signals with complementary signals for use in indirectly clocking the fully differential switching mixer. In the example implementation of FIG. 5, the frequency divider circuit 507 includes a first divide-by-2 circuit 506 which generates VCO/2 and VCOB/2 signals. The frequency divider circuit 507 also includes a second divide-by-2 quadrature generator circuit 508 to produce the in-phase clocking signals I, IB and the quadrature clocking signals Q, QB. However, it will be appreciated that the frequency divider circuit 507 may also be implemented with a single, compact divide-by-4 quadrature generator circuit to produce the in-phase and quadrature clocking signals. The output of the frequency divider circuit 507 is provided to an output buffer 510 which generates buffered in-phase clocking signals I, IB and the quadrature clocking signals Q, QB. At the output of the buffer 510, the in-phase clocking signal I is in phase (e.g., 0°) with the VCO input signal, while the complementary in-phase clocking signal IB is phase shifted by 180°. In addition, the quadrature clocking signal Q is phase shifted by 90° from the VCO input signal, while the complementary quadrature clocking signal QB is phase shifted by 270°.

Figure 5:
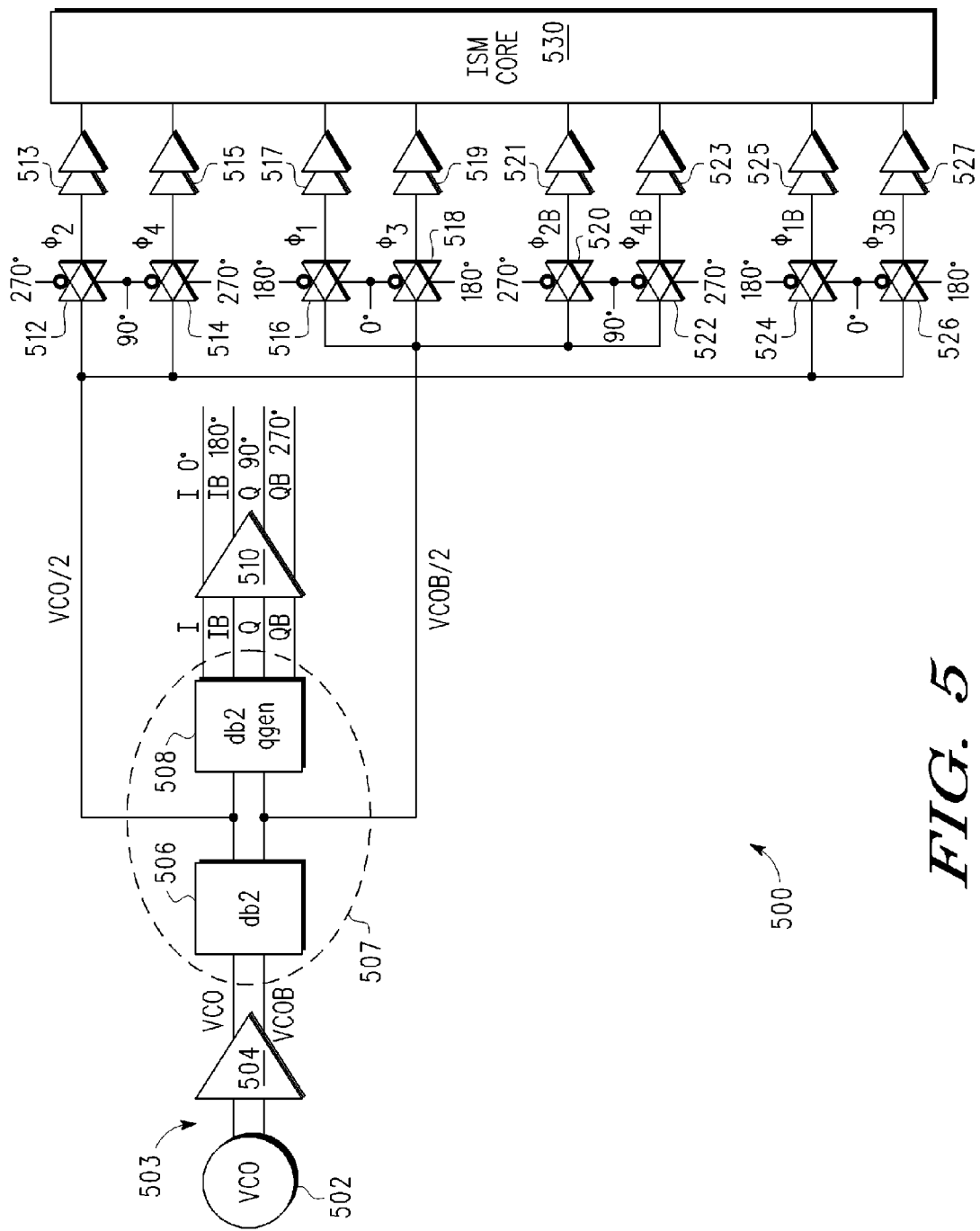
FIG. 5 is a schematic representation of a quarter duty cycle pulse generator for generating local oscillator signals for an interleaved switching mixer in accordance with a first exemplary embodiment.

Rather than directly clocking the switching mixer 530, the in-phase and quadrature clocking signals I, IB, Q, QB are used to control the transmission gates 512, 514, 516, 518, 520, 522, 524, 526 to switch the complementary input frequency signals VCO/2 and VCOB/2, thereby generating four interleaved LO pulses $Ø_1$, $Ø_2$, $Ø_3$, $Ø_4$ and their respective complements $Ø_{1B}$, $Ø_{2B}$, $Ø_{3B}$, $Ø_{4B}$. Thus, the transmission gate 516 receives the input signal VCOB/2, and is gated by the in-phase clocking signals I, IB to generate the local oscillator signals $Ø_1$. Conversely, the transmission gate 524 receives the input signal VCO/2, and is gated by the in-phase clocking signals I, IB to generate the local oscillator signals $Ø_{1B}$. As for the local oscillator signals $\varnothing_2$ and $\varnothing_{2B}$, the transmission gate 512 receives the input signal VCO/2, and is gated by the quadrature clocking signals Q, QB to generate the local oscillator signals $\varnothing_2$, while the transmission gate 520 receives the input signal VCOB/2, and is gated by the quadrature clocking signals Q, QB to generate the local oscillator signals $\varnothing_{2B}$. In similar fashion, the local oscillator signals $\varnothing_3$ is generated by switching the input signal VCOB/2 at transmission gate 518 using the in-phase clocking signals I, IB, while the local oscillator signals $\varnothing_4$ is generated by switching the input signal VCO/2 at transmission gate 514 using the quadrature clocking signals Q, QB, and likewise for the complementary local oscillator signals $\varnothing_{3B}$ and $\varnothing_{4B}$. As depicted in FIG. 5, the outputs of the transmission gates 512, 514, 516, 518, 520, 522, 524, 526 may be buffered with one or more regenerative buffers 513, 515, 517, 519, 521, 523, 525, 527, respectively, before being provided to the interleaved switching mixer 530.

In effect, the in-phase and quadrature clocking signals I, IB, Q, QB have one fourth the duty cycle of the received input frequency signals VCO, VCOB to the frequency divider circuit 507, and one half the duty cycle of the VCO/2 and VCOB/2 signals generated by the frequency divider circuit 506. Indeed, the VCO/2 and VCOB/2 signals have the exact pulse that is needed for clocking the interleaved upmixer 530, although the VCO/2 and VCOB/2 signals also have additional pulses that are not needed for clocking the upmixer 530. To remove the unneeded additional pulses, the quarter duty cycle pulse generator 500 uses the frequency divider circuit 508 to generate in-phase and quadrature clocking signals I, IB, Q, QB which have the same frequency as required for clocking the upmixer 530, but use the I, IB, Q, QB signals to control the transmission gating of the received input frequency signals VCO/2 and VCOB/2 to generate the four (differentially eight) interleaved LO pulses $\varnothing_1, \varnothing_{1B}, \ldots \varnothing_4, \varnothing_{4B}$.

Figure 6:
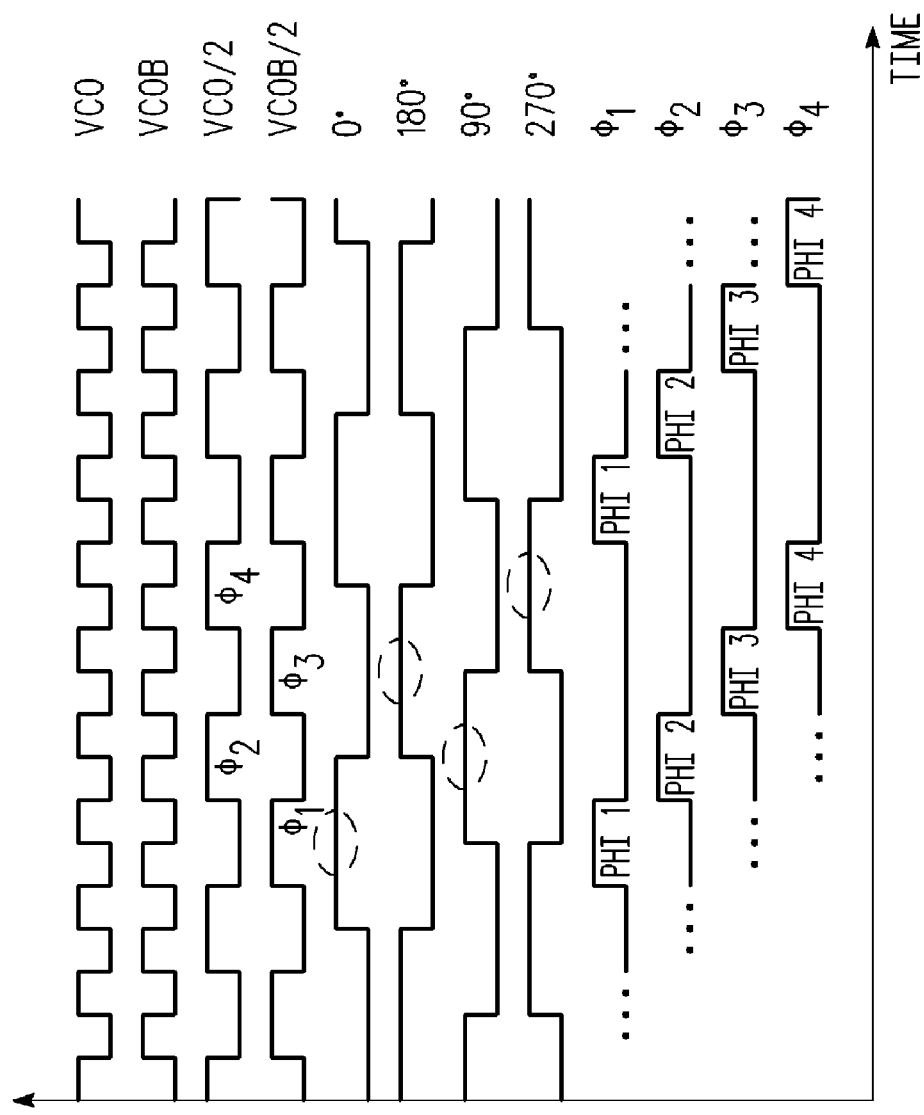
FIG. 6 is waveform depicting the operation of the quarter duty cycle pulse generator depicted in FIG. 5.

The resulting waveforms from the operation of the quarter duty cycle pulse generator 500 are depicted in FIG. 6. As these waveforms show, the first interleaved LO pulse signal $\varnothing_1$ is generated by switching the input signal VCOB/2 by 0°, the second interleaved LO pulse signal $\varnothing_2$ is generated by switching the input signal VCO/2 by 90°, the third interleaved LO pulse signal $\varnothing_3$ is generated by switching the input signal VCOB/2 by 180°, and the fourth interleaved LO pulse signal $\varnothing_4$ is generated by switching the input signal VCOB/2 by 270°.

It will be appreciated that the T-gates in the interleaved switching mixer may also be controlled by higher frequency matched differential interleaved local oscillator signals $\varnothing_1$, $\varnothing_2, \varnothing_3, \varnothing_4$ (and their respective complements). To this end, a second exemplary low band embodiment is disclosed for generating the required matched differential interleaved local oscillator signals with a half duty cycle pulse generator 700 such as illustrated by way of example with the schematic representation of FIG. 7. In the depicted pulse generator 700, a VCO 702 (e.g., from a transmit PLL circuit) generates complementary input clock signals 703 which are provided to a VCO buffer 704 which, in turn, generates VCO and VCOB signals to drive the frequency divider circuit 706 to produce in-phase I and quadrature Q clocking signals with complementary signals for use in indirectly clocking the fully differential switching mixer 720. As depicted, the frequency divider circuit 706 includes a divide-by-2 quadrature generator circuit to produce the in-phase clocking signals I, IB and the quadrature clocking signals Q, QB. The output of the frequency divider circuit 706 is provided to an output buffer 708 which generates buffered in-phase clocking signals I, IB and the quadrature clocking signals Q, QB. At the output of the buffer 708, the in-phase clocking signal I is in phase (e.g., 0°) with the VCO input signal, while the complementary in-phase clocking signal IB is phase shifted by 180°. In addition, the quadrature clocking signal Q is phase shifted by 90° from the VCO input signal, while the complementary quadrature clocking signal QB is phase shifted by 270°.

Figure 7:
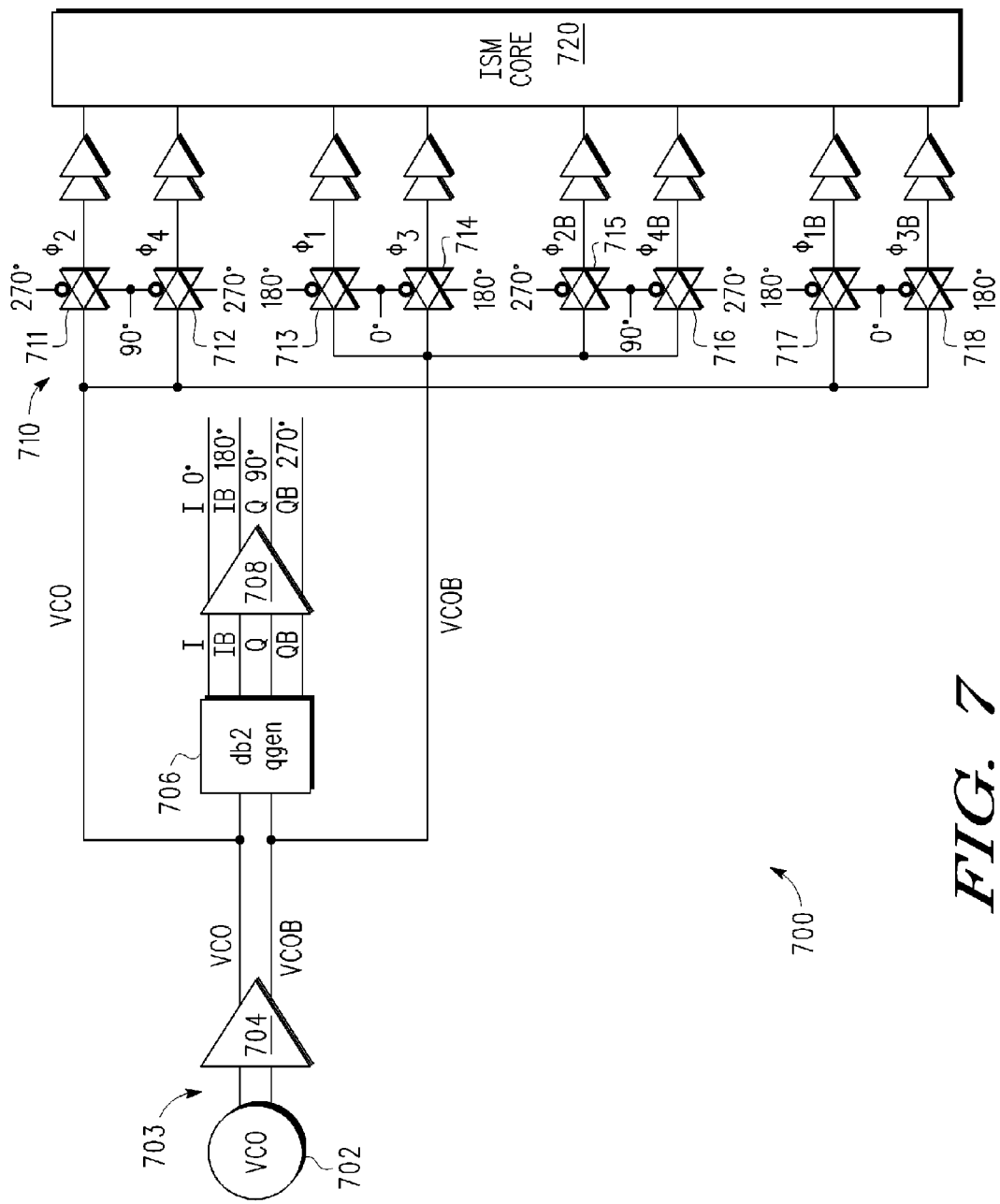
FIG. 7 is a schematic representation of a half duty cycle pulse generator for generating local oscillator signals for an interleaved switching mixer in accordance with a second exemplary embodiment.

Rather than directly clocking the switching mixer 720, the in-phase and quadrature clocking signals I, IB, Q, QB are used to control the transmission gates 711-718 configured in a matched switching topology 710 to switch the complementary input frequency signals VCO and VCOB, thereby generating four interleaved LO pulses $\varnothing_1, \varnothing_2, \varnothing_3, \varnothing_4$ and their respective complements $\varnothing_{1B}, \varnothing_{2B}, \varnothing_{3B}, \varnothing_{4B}$. As depicted in FIG. 7, the outputs of the transmission gates 711-718 may be buffered with one or more regenerative buffers before being provided to the interleaved switching mixer 720. The operation of the matched switching topology 710 is similar to the description provided with reference to FIG. 5, except that the transmission gates 711-718 are receiving input signals VCO and VCOB, as opposed to VCO/2 and VCOB/2. As a result, the switching of the received input signals VCO and VCOB by the in-phase and quadrature clocking signals I, IB, Q, QB generate the local oscillator signals $\varnothing_1, \varnothing_{1B}$, etc., which have only half the duty cycle of the received input frequency signals VCO, VCOB. Again, the VCO and VCOB signals have the exact pulse that is needed for clocking the interleaved upmixer 720, although the VCO and VCOB signals also have additional pulses that are not needed for clocking the upmixer 720. To remove the unneeded additional pulses, the half duty cycle pulse generator 700 uses the frequency divider circuit 708 to generate in-phase and quadrature clocking signals I, IB, Q, QB which have the same frequency as required for clocking the upmixer 720, but use the I, IB, Q, QB signals to control the transmission gating of the received input frequency signals VCO and VCOB to generate the four (differentially eight) interleaved LO pulses $\varnothing_1, \varnothing_{1B}, \ldots \varnothing_4, \varnothing_{4B}$.

Figure 8:
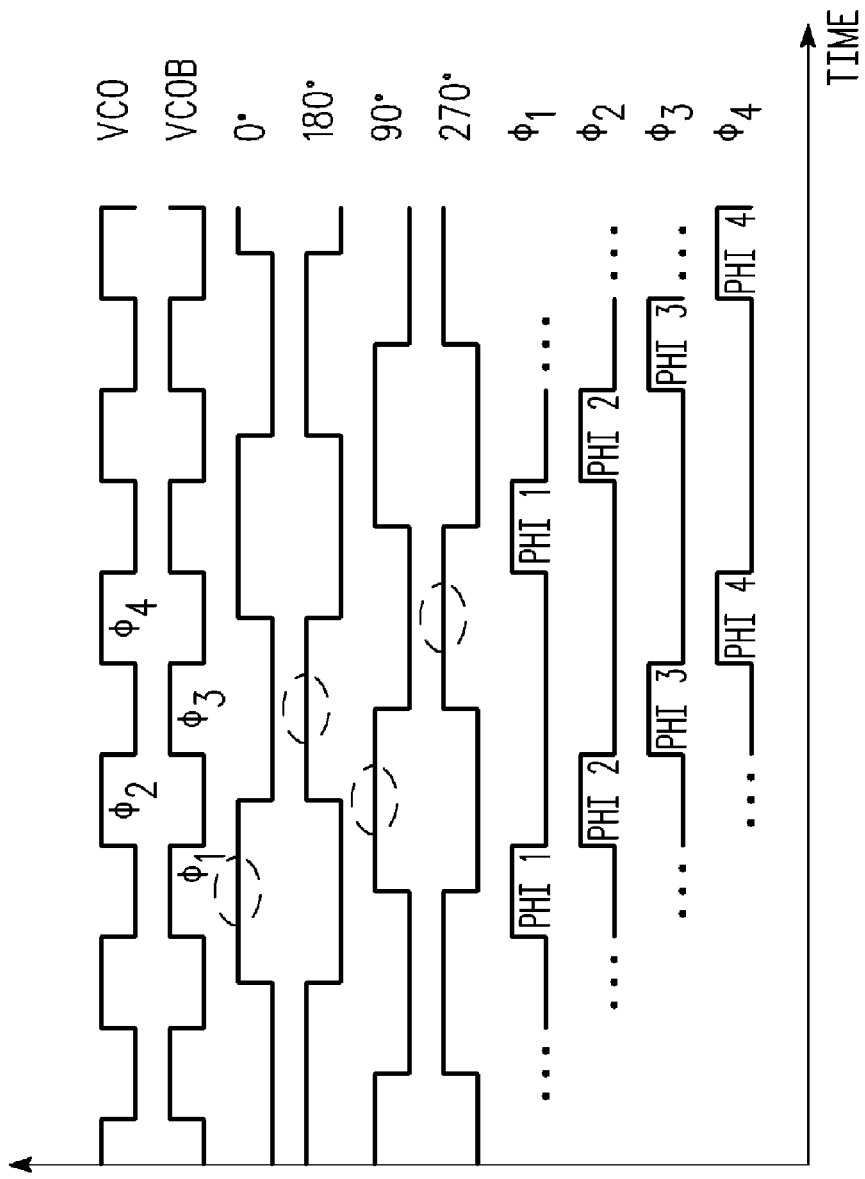
FIG. 8 is waveform depicting the operation of the half duty cycle pulse generator depicted in FIG. 7.
Figure 9:
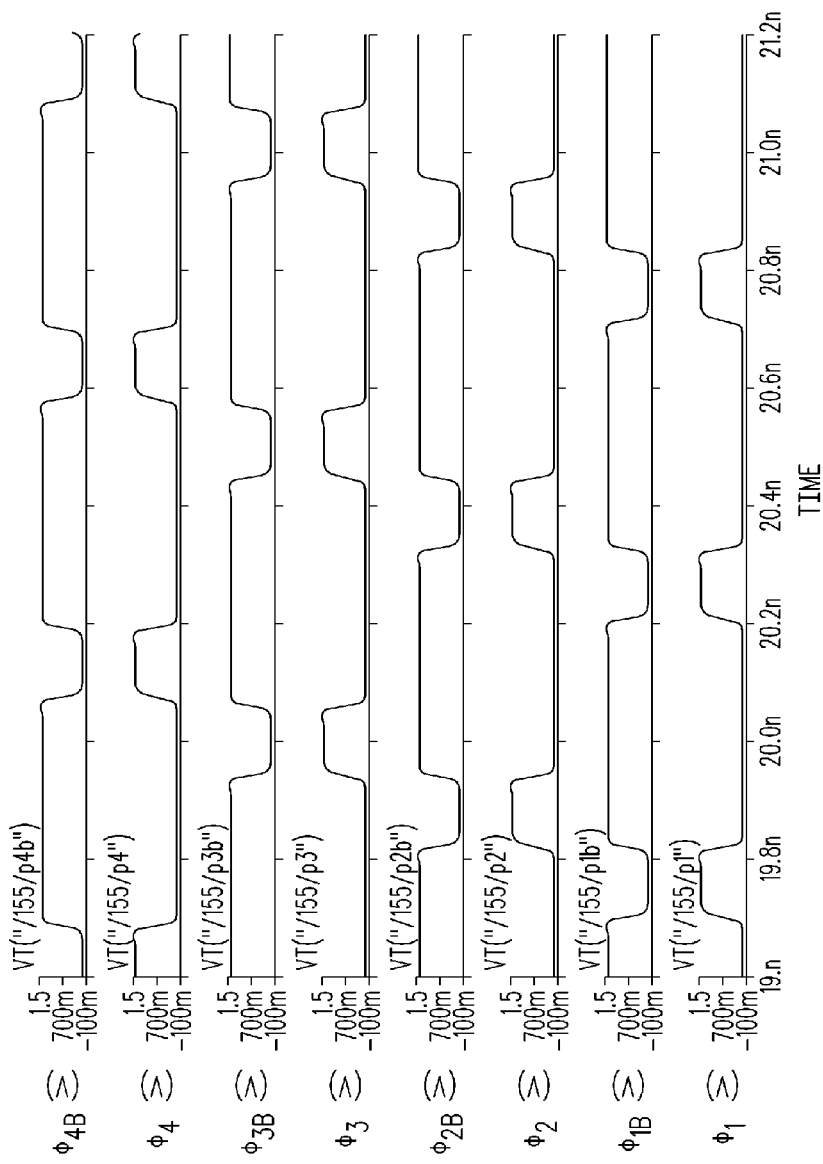
FIG. 9 is waveform depicting the matched differential interleaved local oscillator signals from a quarter duty cycle pulse generator in accordance with selected embodiments of the present invention.

The resulting waveforms from the operation of the half duty cycle pulse generator 700 are depicted in FIG. 8. As these waveforms show, the first interleaved LO pulse signal $\varnothing_1$ is generated by switching the input signal VCOB by the 0° in-phase signal I (and its complement), the second interleaved LO pulse signal $\varnothing_2$ is generated by switching the input signal VCO by the 90° quadrature signal Q (and its complement), the third interleaved LO pulse signal $\varnothing_3$ is generated by switching the input signal VCO by the 180° in-phase signal IB (and its complement), and the fourth interleaved LO pulse signal $\varnothing_4$ is generated by switching the input signal VCOB by the 270° quadrature signal QB (and its complement). As will be appreciated, the four complementary interleaved LO pulse signals $\varnothing_{1B}, \varnothing_{2B}, \varnothing_{3B}, \varnothing_{4B}$ are each out of phase by 180° from their respective interleaved LO pulses $\varnothing_1, \varnothing_2, \varnothing_3, \varnothing_4$, as illustrated in FIG. 9 which depicts the simulated waveforms of the matched differential interleaved local oscillator signals which could be generated from either the quarter duty cycle pulse generator 500 or the half duty cycle pulse generator 700.

Figure 10:
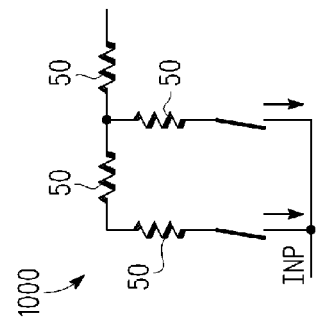
FIG. 10 is a schematic representation of a digital variable gain amplifier that may be used as an attenuator in the interleaved IQ modulation system in accordance with selected embodiments of the present invention.

As explained above, the interleaved LO pulses $\varnothing_1$, $\varnothing_{1B}, \ldots \varnothing_4, \varnothing_{4B}$ that are applied to the upmixer are generated with a matched switching topology which selectively passes pulses from an input frequency signal (e.g., VCO or VCO/2) by using transmission gates that are controlled by the output signals I, IB, Q, QB from a divided quadrature generator. By applying the interleaved LO pulses $\varnothing_1, \varnothing_{1B}, \ldots \varnothing_4, \varnothing_{4B}$ to control the transmission gates in the upmixer (e.g., switches 26, 28, 30, 32, 34, 36, 38, and 40 shown in FIG. 3), the upmixer multiplexes or interleaves the +I, −I, +Q, −Q input signals to produce differential outputs 42 and 44. In turn, the differential outputs are applied to an attenuator circuit, such as the digital variable gain amplifier shown in FIG. 2. In selected embodiments, the attenuator circuit 1000 is implemented with a passive R-2R ladder architecture, such as shown in FIG. 10. The depicted R-2R ladder architecture includes a plurality of resistors 50 connected in parallel or series. The number of resistors in parallel or series depends on how many attenuation steps are desired. The R-2R ladder architecture provides substantially constant output impedance, such as 50 ohms, regardless of power. Of course, the attenuator 1000 may include additional, different, or fewer components.

In accordance with the various embodiments described herein, an interleaved LO pulse generator is described which can be used with an integrated circuit RF transceiver that is capable of implemented a number of high speed wireless transmission protocols, such as the Enhanced Data rates for GSM Evolution (EDGE) or Wideband Code Division Multiple Access (WCDMA) protocols. The interleaved LO pulse generator embodiments can be implemented using CMOS technology to combine analog or RF signals in IQ modulation by interleaving. Further, it can be implemented using one mixer instead of two separate mixers for 1 and Q signals and a summer block. The modulator described both up-converts and combines analog I and Q signals. Further, the modulator supports wide-band signals which may include zero-crossings.

An exemplary embodiment relates to an integrated circuit that provides in-phase and quadrature ("IQ") modulation by interleaving the in-phase and quadrature signals at a rate of 4× the carrier frequency. Interleaving these signals provides for a full quadrature modulation. Because the I and Q paths are not resistively summed together, there is no penalty in terms of power efficiency. The integrated circuit can be implemented in a switched-mode modulator, which would show high linearity, low noise, and low current consumption.

By now it should be appreciated that there has been provided a method and circuit for generating matched differential interleaved local oscillator signals in an integrated transmitter circuit configured to perform IQ modulation by interleaving in-phase and quadrature signals. The disclosed transmitter circuit includes a baseband stage for generating in-phase and quadrature analog input signals. The transmitter circuit also includes a local oscillator (LO) pulse generator that generates matched differential interleaved local oscillator signals from first and second input reference signals by selectively passing pulses from the first and second input reference signals. As described, the LO pulse generator includes a frequency dividing quadrature generator circuit that generates in-phase and quadrature clocking signals from first and second reference VCO signals, and a plurality of transmission gates configured in a matched switching topology to selectively pass pulses from the first and second reference VCO signals under control of the in-phase and quadrature clocking signals. For example, the plurality of transmission gates may include a first transmission gate for generating a first phase local oscillator signal from the second reference VCO signal under control of the in-phase clocking signal; a second transmission gate for generating a second phase local oscillator signal from the first reference VCO signal under control of the quadrature clocking signal; a third transmission gate for generating a third phase local oscillator signal from the second reference VCO signal under control of the in-phase clocking signal; and a fourth transmission gate for generating a fourth phase local oscillator signal from the first reference VCO signal under control of the quadrature clocking signal. In similar fashion, complements to the local oscillator signals may be generated with separate transmission gates. In selected embodiments, the frequency dividing quadrature generator circuit includes a VCO circuit for generating first and second VCO signals, a divide-by-two frequency divider circuit for generating first and second reference VCO signals from the first and second VCO signals, and a divide-by-two quadrature generator circuit for generating in-phase and quadrature clocking signals from the first and second reference VCO signals. In other embodiments, the frequency dividing quadrature generator circuit includes a VCO circuit for generating first and second reference VCO signals, and a divide-by-two quadrature generator circuit for generating in-phase and quadrature clocking signals from the first and second reference VCO signals. In the transmitter, a switching mixer uses a plurality of switches to produce a differential signal by interleaving the in-phase and quadrature analog input signals over a plurality of phases of a carrier period under control of the matched differential interleaved local oscillator signals. The switching mixer may be implemented with a plurality of transmission gates which are gated by the matched differential interleaved local oscillator signals to interleave the in-phase and quadrature analog input signals by communicating a first in-phase signal at a first phase, communicating a first quadrature phase signal at a second phase, communicating a second in-phase signal at a third phase, and communicating a second quadrature phase signal at a fourth phase.

In another form, there is provided a method, circuit, and system for performing IQ modulation by interleaving in-phase and quadrature signals. As disclosed, matched differential interleaved local oscillator signals are generated from a first VCO reference signal and a second complementary VCO reference signal by selectively passing pulses from the first VCO reference signal and the second complementary VCO reference signal. In selected embodiments, the matched differential interleaved local oscillator signals are generated by frequency dividing the first VCO reference signal and the second complementary VCO reference signal to generate in-phase and quadrature clocking signals (e.g., I, IB, Q, and QB) separated in phase from each other by substantially ninety degrees, and then selectively passing pulses from the first VCO reference signal and the second complementary VCO reference signal through a plurality of transmission gates configured in a matched switching topology under control of the in-phase and quadrature clocking signals, thereby generating matched differential interleaved local oscillator signals (e.g., LO pulse signals Ø1, Ø1B, Ø2, Ø2B, Ø3, Ø3B, Ø4, and Ø4B). The frequency division step may be implemented by frequency dividing first and second VCO signals (which have a first frequency) to produce the first VCO reference signal and the second complementary VCO reference signal (which have a second frequency which is half of the first frequency), and then generating in-phase and quadrature clocking signals from the first VCO reference signal and the second complementary VCO reference signal, where the in-phase and quadrature clocking signals each have a third frequency which is half of the second frequency such that the in-phase and quadrature clocking signals are separated in phase from each other by substantially ninety degrees. Alternatively, the frequency division step may be implemented by generating in-phase and quadrature clocking signals from the first VCO reference signal and the second complementary VCO reference signal (which have a first frequency), where the in-phase and quadrature clocking signals each have a second frequency which is half of the first frequency such that the in-phase and quadrature clocking signals are separated in phase from each other by substantially ninety degrees. As for the step of selectively passing reference signal pulses, this may be implemented, for example, by simultaneously applying the first VCO reference signal (and second complementary VCO reference signal) through a first transmission gate (and second transmission gate) that is controlled by the second in-phase clocking signal to generate a first LO pulse signal Ø1 (and the complementary first LO pulse signal Ø1B), where the first and second transmission gates create substantially no propagation delay between the first LO pulse signal Ø1 and the complementary first LO pulse signal Ø1B. Stated more generally, pulses from the first VCO reference signal and the second complementary VCO reference signal are selectively passed through a plurality of transmission gates configured in a matched switching topology under control of the I, IB, Q, and QB clocking signals, thereby generating matched differential interleaved local oscillator signals comprising a first set of LO pulse signals and a second set of complementary LO pulse signals such that there is substantially no propagation delay between the first set of LO pulse signals and the second set of complementary LO pulse signals. Under control of the matched differential interleaved local oscillator signals, received in-phase and quadrature input signals are interleaved over a plurality of phases of a carrier period to produce a differential signal. To interleave the in-phase and quadrature input signals, pulses from the first VCO reference signal and the second complementary VCO reference signal may be selected passed through a plurality of transmission gates configured in a matched switching topology under control of the in-phase and quadrature clocking signals, thereby communicating a first in-phase signal at a first phase, communicating a first quadrature phase signal at a second phase, communicating a second in-phase signal at a third phase, and communicating a second quadrature phase signal at a fourth phase.

In yet another form, there is provided a method, circuit, and system for generating matched differential interleaved local oscillator clock signals. As a preliminary step, first and second (complementary) VCO reference signals are generated, either directly from a voltage controlled oscillator (and buffer) or after being divided by a frequency divider circuit. Based on first and second VCO reference signals, a first in-phase clocking signal is generated with half the frequency of the first VCO reference signal, a second in-phase clocking signal is generated that is separated in phase from the first in-phase clocking signal by substantially one hundred and eighty degrees, a first quadrature clocking signal is generated that is separated in phase from the first in-phase clocking signal by substantially ninety degrees, and a second quadrature clocking signal is generated that is separated in phase from the first quadrature clocking signal by substantially one hundred and eighty degrees. Under control of the generated clocking signals, pulses from the first and second VCO reference signals are selectively passed through a plurality of transmission gates configured in a matched switching topology, thereby generating matched differential interleaved local oscillator signals comprising a first set of local oscillator pulse signals and a second set of complementary local oscillator pulse signals such that there is substantially no propagation delay between the first set of local oscillator pulse signals and the second set of complementary local oscillator pulse signals. In an example embodiment, pulses from the first and second VCO reference signals are selectively passed by applying the first VCO reference signal through a first transmission gate that is controlled by at least the first quadrature clocking signal to generate a second LO pulse signal Ø2; applying the first VCO reference signal through a second transmission gate that is controlled by at least the second quadrature clocking signal to generate a fourth LO pulse signal Ø4; applying the second complementary VCO reference signal through a third transmission gate that is controlled by at least the first in-phase clocking signal to generate a first LO pulse signal Ø1; applying the second complementary VCO reference signal through a fourth transmission gate that is controlled by at least the second in-phase clocking signal to generate a third LO pulse signal Ø3; applying the second complementary VCO reference signal through a fifth transmission gate that is controlled by at least the first quadrature clocking signal to generate a complementary second LO pulse signal Ø2B; applying the second complementary VCO reference signal through a sixth transmission gate that is controlled by at least the second quadrature clocking signal to generate a complementary fourth LO pulse signal Ø4B; applying the first VCO reference signal through a seventh transmission gate that is controlled by at least the first in-phase clocking signal to generate a complementary first LO pulse signal Ø1B; and applying the first VCO reference signal through an eighth transmission gate that is controlled by at least the second in-phase clocking signal to generate a complementary third LO pulse signal Ø3B. Finally, the matched differential interleaved local oscillator clock signals may be applied to an interleaved switching upmixer to interleave in-phase and quadrature input signals over a plurality of phases of a carrier period.

The methods and systems for generating interleaved LO pulses for use in clocking an interleaved switching mixer as shown and described herein with reference to specific embodiments may be implemented in other circuit and/or processor configurations. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A transmitter circuit configured to perform IQ modulation by interleaving in-phase and quadrature signals, comprising:
  a baseband stage for generating in-phase and quadrature analog input signals;
  a local oscillator pulse generator for generating, comprising:
  a frequency dividing quadrature generator circuit that is coupled to receive first and second reference VCO signals and to generate therefrom in-phase and quadrature clocking signals separated in phase from each other by substantially ninety degrees; and
  a plurality of transmission gates configured in a matched switching topology so as to selectively pass pulses from the first and second reference VCO signals under control of the in-phase and quadrature clocking signals, thereby generating matched differential interleaved local oscillator signals; and a switching mixer comprising a plurality of switches for simultaneously receiving the matched differential interleaved local oscillator signals and producing a differential signal by interleaving the in-phase and quadrature analog input signals over a plurality of phases of a carrier period under control of the matched differential interleaved local oscillator signals.

2. The transmitter circuit of claim 1, where the frequency dividing quadrature generator circuit comprises:

a voltage controlled oscillator circuit for generating first and second VCO signals;

a divide-by-two frequency divider circuit coupled to receive the first and second VCO signals from the voltage controlled oscillator circuit and to generate therefrom first and second reference VCO signals; and a divide-by-two quadrature generator circuit coupled to receive the first and second reference VCO signals from the divide-by-two frequency divider circuit and to generate therefrom in-phase and quadrature clocking signals separated in phase from each other by substantially ninety degrees.

3. The transmitter circuit of claim 1, where the frequency dividing quadrature generator circuit comprises:

a voltage controlled oscillator circuit for generating first and second reference VCO signals;

a divide-by-two quadrature generator circuit coupled to receive the first and second reference VCO signals from the voltage controlled oscillator circuit and to generate therefrom in-phase and quadrature clocking signals separated in phase from each other by substantially ninety degrees.

4. The transmitter circuit of claim 1, where the switching mixer comprises a plurality of transmission gates which are gated by the matched differential interleaved local oscillator signals to interleave the in-phase and quadrature analog input signals by communicating a first in-phase signal at a first phase, communicating a first quadrature phase signal at a second phase, communicating a second in-phase signal at a third phase, and communicating a second quadrature phase signal at a fourth phase.

5. The transmitter circuit of claim 1, where the local oscillator pulse generator comprises:

a frequency dividing quadrature generator circuit that is coupled to receive first and second reference VCO signals and to generate therefrom in-phase and quadrature clocking signals separated in phase from each other by substantially ninety degrees;

a first transmission gate for generating a first phase local oscillator signal from the second reference VCO signal under control of the in-phase clocking signal;

a second transmission gate for generating a second phase local oscillator signal from the first reference VCO signal under control of the quadrature clocking signal;

a third transmission gate for generating a third phase local oscillator signal from the second reference VCO signal under control of the in-phase clocking signal; and a fourth transmission gate for generating a fourth phase local oscillator signal from the first reference VCO signal under control of the quadrature clocking signal.

6. The transmitter circuit of claim 5, where the local oscillator pulse generator comprises:

a fifth transmission gate for generating a complement of the first phase local oscillator signal from the first reference VCO signal under control of the in-phase clocking signal;

a sixth transmission gate for generating a complement of the second phase local oscillator signal from the second reference VCO signal under control of the quadrature clocking signal;

a seventh transmission gate for generating a complement of the third phase local oscillator signal from the first reference VCO signal under control of the in-phase clocking signal; and an eighth transmission gate for generating a complement of the fourth phase local oscillator signal from the second reference VCO signal under control of the quadrature clocking signal.

7. A method of performing IQ modulation by interleaving in-phase and quadrature signals, comprising:

receiving in-phase and quadrature input signals;

frequency dividing a first VCO reference signal and a second complementary VCO reference signal to generate in-phase and quadrature clocking signals separated in phase from each other by substantially ninety degrees; and selectively passing pulses from the first VCO reference signal and the second complementary VCO reference signal through a plurality of transmission gates configured in a matched switching topology under control of the in-phase and quadrature clocking signals, thereby generating matched differential interleaved local oscillator signals;

and applying the matched differential interleaved local oscillator signals to a plurality of switches in a switching mixer for interleaving the in-phase and quadrature input signals over a plurality of phases of a carrier period under control of the matched differential interleaved local oscillator signals to produce a differential signal.

8. The method of claim 7 where frequency dividing the first VCO reference signal and the second complementary VCO reference signal comprises:

receiving first and second VCO signals having a first frequency from a voltage controlled oscillator circuit;

frequency dividing the first and second VCO signals to produce the first VCO reference signal and the second complementary VCO reference signal, each of which has a second frequency which is half of the first frequency; and generating in-phase and quadrature clocking signals from the first VCO reference signal and the second complementary VCO reference signal, where the in-phase and quadrature clocking signals each have a third frequency which is half of the second frequency such that the in-phase and quadrature clocking signals are separated in phase from each other by substantially ninety degrees.

9. The method of claim 7 where frequency dividing the first VCO reference signal and the second complementary VCO reference signal comprises:

receiving the first VCO reference signal and the second complementary VCO reference signal having a first frequency from a voltage controlled oscillator circuit;

generating in-phase and quadrature clocking signals from the first VCO reference signal and the second complementary VCO reference signal, where the in-phase and quadrature clocking signals each have a second frequency which is half of the first frequency such that the in-phase and quadrature clocking signals are separated in phase from each other by substantially ninety degrees.

10. The method of claim 7 where interleaving the in-phase and quadrature input signals comprises selectively passing pulses from the first VCO reference signal and the second complementary VCO reference signal through a plurality of transmission gates configured in a matched switching topology under control of the in-phase and quadrature clocking signals, thereby communicating a first in-phase signal at a first phase, communicating a first quadrature phase signal at a second phase, communicating a second in-phase signal at a third phase, and communicating a second quadrature phase signal at a fourth phase.

11. The method of claim 7, where generating matched differential interleaved local oscillator signals comprises:
frequency dividing the first VCO reference signal and the second complementary VCO reference signal to generate a first in-phase clocking signal, a second in-phase clocking signal separated in phase from the first in-phase clocking signal by substantially one hundred and eighty degrees, a first quadrature clocking signal separated in phase from the first in-phase clocking signal by substantially ninety degrees, and a second quadrature clocking signal separated in phase from the first quadrature clocking signal by substantially one hundred and eighty degrees; and
selectively passing pulses from the first VCO reference signal and the second complementary VCO reference signal through a plurality of transmission gates configured in a matched switching topology under control of the first in-phase clocking signal, second in-phase clocking signal, first quadrature clocking signal, and second quadrature clocking signal, thereby generating matched differential interleaved local oscillator signals comprising a first LO pulse signal $\emptyset_1$, a second LO pulse signal $\emptyset_2$, a third LO pulse signal $\emptyset_3$, and a fourth LO pulse signal $\emptyset_4$.

12. The method of claim 11 where selectively passing pulses from the first VCO reference signal and the second complementary VCO reference signal comprises:
applying the first VCO reference signal through a first transmission gate that is controlled by the second in-phase clocking signal to generate a first LO pulse signal $\emptyset_1$; and
applying the second complementary VCO reference signal through a second transmission gate that is controlled by the second in-phase clocking signal to generate a complementary first LO pulse signal $\emptyset_{1B}$,
where the first and second transmission gates create substantially no propagation delay between the first LO pulse signal $\emptyset_1$ and the complementary first LO pulse signal $\emptyset_{1B}$.

13. The method of claim 7, where generating matched differential interleaved local oscillator signals comprises
generating a first in-phase clocking signal I with half the frequency of the first VCO reference signal,
generating a second in-phase clocking signal IB separated in phase from the first in-phase clocking signal I by substantially one hundred and eighty degrees,
generating a first quadrature clocking signal Q separated in phase from the first in-phase clocking signal I by substantially ninety degrees,
generating a second quadrature clocking signal QB separated in phase from the first quadrature clocking signal Q by substantially one hundred and eighty degrees, selectively passing pulses from the first VCO reference signal and the second complementary VCO reference signal through a plurality of transmission gates configured in a matched switching topology under control of the first in-phase clocking signal I, second in-phase clocking signal IB, first quadrature clocking signal Q, and second quadrature clocking signal QB, thereby generating matched differential interleaved local oscillator signals comprising a first set of LO pulse signals and a second set of complementary LO pulse signals such that there is substantially no propagation delay between the first set of LO pulse signals and the second set of complementary LO pulse signals.

14. A method for generating matched differential interleaved local oscillator clock signals, comprising:
generating a first VCO reference signal and a second complementary VCO reference signal;
generating from the first VCO reference signal and the second complementary VCO reference signal a first in-phase clocking signal with half the frequency of the first VCO reference signal, a second in-phase clocking signal separated in phase from the first in-phase clocking signal by substantially one hundred and eighty degrees, a first quadrature clocking signal separated in phase from the first in-phase clocking signal by substantially ninety degrees, and a second quadrature clocking signal separated in phase from the first quadrature clocking signal by substantially one hundred and eighty degrees; and
selectively passing pulses from the first VCO reference signal and the second complementary VCO reference signal through a plurality of transmission gates configured in a matched switching topology under control of the first in-phase clocking signal, second in-phase clocking signal, first quadrature clocking signal, and second quadrature clocking signal, thereby generating matched differential interleaved local oscillator signals comprising a first set of local oscillator pulse signals and a second set of complementary local oscillator pulse signals such that there is substantially no propagation delay between the first set of local oscillator pulse signals and the second set of complementary local oscillator pulse signals.

15. The method of claim 14, where generating the first VCO reference signal and the second complementary VCO reference signal comprises:
receiving first and second VCO signals having a first frequency from a voltage controlled oscillator circuit; and
frequency dividing the first and second VCO signals to generate the first VCO reference signal and the second complementary VCO reference signal, each of which has a second frequency which is half of the first frequency.

16. The method of claim 14, where generating the first VCO reference signal and the second complementary VCO reference signal comprises: receiving the first VCO reference signal and the second complementary VCO reference signal having a first frequency from a voltage controlled oscillator circuit.

17. The method of claim 14, where selectively passing pulses from the first VCO reference signal and the second complementary VCO reference signal comprises:
applying the first VCO reference signal through a first transmission gate that is controlled by at least the first quadrature clocking signal to generate a second LO pulse signal $\emptyset_2$;

applying the first VCO reference signal through a second transmission gate that is controlled by at least the second quadrature clocking signal to generate a fourth LO pulse signal $\varnothing_4$;

applying the second complementary VCO reference signal through a third transmission gate that is controlled by at least the first in-phase clocking signal to generate a first LO pulse signal $\varnothing_1$;

applying the second complementary VCO reference signal through a fourth transmission gate that is controlled by at least the second in-phase clocking signal to generate a third LO pulse signal $\varnothing_3$;

applying the second complementary VCO reference signal through a fifth transmission gate that is controlled by at least the first quadrature clocking signal to generate a complementary second LO pulse signal $\varnothing_{2B}$;

applying the second complementary VCO reference signal through a sixth transmission gate that is controlled by at least the second quadrature clocking signal to generate a complementary fourth LO pulse signal $\varnothing_{4B}$;

applying the first VCO reference signal through a seventh transmission gate that is controlled by at least the first in-phase clocking signal to generate a complementary first LO pulse signal $\varnothing_{1B}$; and applying the first VCO reference signal through an eighth transmission gate that is controlled by at least the second in-phase clocking signal to generate a complementary third LO pulse signal $\varnothing_{3B}$.

18. The method of claim 14, further comprising applying the matched differential interleaved local oscillator clock signals to an interleaved switching upmixer to interleave in-phase and quadrature input signals over a plurality of phases of a carrier period.

* * * * *